United States Patent
Cordero et al.

(10) Patent No.: US 9,300,298 B2
(45) Date of Patent: Mar. 29, 2016

(54) PROGRAMMABLE LOGIC CIRCUIT USING THREE-DIMENSIONAL STACKING TECHNIQUES

(71) Applicant: International Business Machines Corporation, Armonk, NY (US)

(72) Inventors: Edgar R. Cordero, Round Rock, TX (US); Robert B. Tremaine, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 295 days.

(21) Appl. No.: 13/914,720

(22) Filed: Jun. 11, 2013

(65) Prior Publication Data

US 2013/0275823 A1    Oct. 17, 2013

Related U.S. Application Data

(62) Division of application No. 13/080,994, filed on Apr. 6, 2011, now Pat. No. 8,493,089.

(51) Int. Cl.
*H03K 19/08* (2006.01)
*G11C 29/08* (2006.01)
*H03K 19/177* (2006.01)

(52) U.S. Cl.
CPC .............. *H03K 19/08* (2013.01); *G11C 29/08* (2013.01); *H03K 19/17752* (2013.01); *H03K 19/17796* (2013.01)

(58) Field of Classification Search
None
See application file for complete search history.

(56) References Cited

U.S. PATENT DOCUMENTS

| | | | |
|---|---|---|---|
| 6,525,678 B1 * | 2/2003 | Veenstra | G11B 20/1426 326/40 |
| 6,553,523 B1 * | 4/2003 | Lindholm et al. | 714/725 |
| 6,668,237 B1 * | 12/2003 | Guccione et al. | 702/119 |
| 7,112,994 B2 | 9/2006 | Madurawe | |
| 7,171,599 B2 * | 1/2007 | Agarwal | 714/725 |
| 7,268,581 B1 * | 9/2007 | Trimberger | H03K 19/17736 326/38 |
| 7,269,724 B1 * | 9/2007 | Trimberger et al. | 713/100 |
| 7,511,641 B1 * | 3/2009 | Chen | H03M 7/40 326/38 |
| 7,525,344 B2 * | 4/2009 | Teig | H03K 19/17704 326/38 |
| 7,529,992 B1 * | 5/2009 | Teig et al. | 714/725 |
| 7,673,273 B2 | 3/2010 | Madurawe et al. | |

(Continued)

OTHER PUBLICATIONS

Raminda Madurawe "Taking Semiconductors to the next level" Tierlogic; Hot Chips, Aug. 2010; pp. 1-16.

*Primary Examiner* — Alexander H Taningco
*Assistant Examiner* — Nelson Correa
(74) *Attorney, Agent, or Firm* — Cantor Colburn LLP

(57) ABSTRACT

A method of configuring a plurality of configurable integrated circuit dies including receiving a configuration data stream at a die stack. The configuration data stream includes configuration memory data for logic devices located on dies in the die stack. At least two of the dies are located on different substrates. The method also includes, performing for each of the dies in the die stack: receiving the configuration memory data for the die, storing the configuration memory data for the die in a configuration memory on the die, determining whether the configuration data stream includes configuration memory data for an additional die in the die stack, and transmitting the configuration data stream to the additional die in the die stack in response to the configuration data stream including configuration memory data for the additional die in the die stack.

9 Claims, 10 Drawing Sheets

(56) References Cited

U.S. PATENT DOCUMENTS

| | | |
|---|---|---|
| 7,679,399 B2 | 3/2010 | Madurawe |
| 7,725,803 B1 * | 5/2010 | Tang et al. .................... 714/758 |
| 7,759,705 B2 | 7/2010 | Madurawe |
| 7,777,319 B2 | 8/2010 | Madurawe |
| 7,973,555 B1 * | 7/2011 | Trimberger ...... H03K 19/17736 326/38 |
| 7,998,853 B1 * | 8/2011 | Rahman ............ H01L 21/76898 257/E21.499 |
| 8,327,201 B1 * | 12/2012 | Lai ................. G01R 31/318513 324/762.03 |
| 8,493,089 B2 * | 7/2013 | Cordero ........... H03K 19/17796 326/101 |
| 8,922,243 B2 * | 12/2014 | Jayasena ............ H03K 19/1776 326/38 |
| 8,982,581 B2 * | 3/2015 | Karp ....................... H01L 23/60 257/173 |
| 2009/0066365 A1 * | 3/2009 | Solomon ............. G06F 17/5054 326/41 |
| 2009/0128188 A1 | 5/2009 | Madurawe |
| 2010/0032809 A1 | 2/2010 | Collins et al. |
| 2012/0002392 A1 | 1/2012 | Karp et al. |

* cited by examiner

PROGRAMMABLE LOGIC CIRCUIT USING THREE-DIMENSIONAL STACKING TECHNIQUES

CROSS REFERENCE TO RELATED APPLICATION

This application is a divisional of U.S. patent application Ser. No. 13/080,994 filed Apr. 6, 2011, the content of which is incorporated by reference herein in its entirety.

BACKGROUND

The present invention relates to integrated circuits, and more specifically, to programmable logic circuits.

One example of a programmable logic circuit is a field programmable gate array ("FPGA"). FPGAs are integrated circuits having an array of configurable logic blocks embedded in a matrix of interconnecting conductors with configurable connections to each other and to the logic blocks. FPGAs and similar configurable/programmable logic circuits (e.g., complex programmable logic devices or "CPLDs") can be modified and updated in order to change their behavior or to function in a system. Each programmable element is made up of two parts: a configurable memory and an associated logic. A factor in determining the size of the memory and the logic in each cell is the programmability of the logic.

Continued semiconductor scaling becomes increasingly difficult and costly due to device dimensions approaching atomic scale. Three-dimensional (3D) integrated circuit chip integration techniques provide a means of significant scaling by electrically coupling two or more integrated circuit chips together, usually coplanar.

Integrated circuit chips are typically built-up layer-by-layer, having the conducting metal, power, and signal interconnections on the face of the chip. One method of providing a two layer chip stack is by having electrical connections between two chips arranged face-to-face with electrical conducting solder structures bonding the signal connections between the two chips with some contacts exposed and connected to the external package for system signal connections.

Another method of providing electric connection between semiconductor chips employs through substrate "vias" (TSVs) that are formed through the substrate of a semiconductor chip. Like conventional vias that are conducting structures used to vertically couple conducting metal layers within a chip, the TSVs reach through to the backside of a die after special wafer thinning processes expose the TSVs. Then additional metal layers may be applied to the backside of the wafer to facilitate having signal connections on both that face and back side of a die that are connected through the die. Two or more die having TSVs may be stacked for very high integrated circuit density.

SUMMARY

An embodiment is a configurable die stack arrangement that includes a first configurable integrated circuit die located on a first substrate. The first configurable integrated circuit die includes a first array and a first configuration memory management circuit that includes an interface to the first array. The first array includes a first logic element and a first configuration memory. The configurable die stack arrangement also includes a second configurable integrated circuit die located on a second substrate. The second substrate is different than the first substrate. The second configurable integrated circuit die includes a second array and a second configuration memory management circuit that includes an interface to the second array. The second array includes a second logic element and a second configuration memory. A signal is coupled to both the first configuration memory management circuit and the second configuration memory management circuit, and the first configuration memory management circuit includes circuitry to control the signal.

Another embodiment is a method of configuring a plurality of configurable integrated circuit dies. The method includes receiving a configuration data stream at a die stack. The configuration data stream includes configuration memory data for logic devices located on dies in the die stack. At least two of the dies are located on different substrates. The method also includes, performing for each of the dies in the die stack: receiving the configuration memory data for the die; storing the configuration memory data for the die in a configuration memory on the die; determining whether the configuration data stream includes configuration memory data for an additional die in the die stack; and transmitting the configuration data stream to the additional die in the die stack in response to the configuration data stream including configuration memory data for the additional die in the die stack.

A further embodiment is a method of testing configuration data for configurable integrated circuit dies. The method includes receiving a test configuration data stream at a die stack. The test configuration data stream includes configuration memory data for logic devices located on dies in the die stack. At least two of the dies in the die stack are located on different substrates and the configuration memory data includes at least one faulty bit. The die stack is placed in a test mode that disables error detection and correction of the configuration data stream. The method further includes performing for each of the dies in the die stack: receiving the configuration memory data for the die; storing the configuration memory data for the die in a configuration memory on the die; determining whether the test configuration data stream includes configuration memory data for an additional die in the die stack; and transmitting the test configuration data stream to the additional die in the die stack responsive to the test configuration data stream including configuration memory data for the additional die in the die stack.

A further embodiment is a programmable logic circuit that includes a through silicon via (TSV), a first die that includes a programmable logic device, and a second die that includes a memory device for storing configuration memory. The programmable logic device and the memory device are configured to communicate via the TSV to program the programmable logic device using the configuration memory. The TSV, the first die and the second die form a three-dimensional stack.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
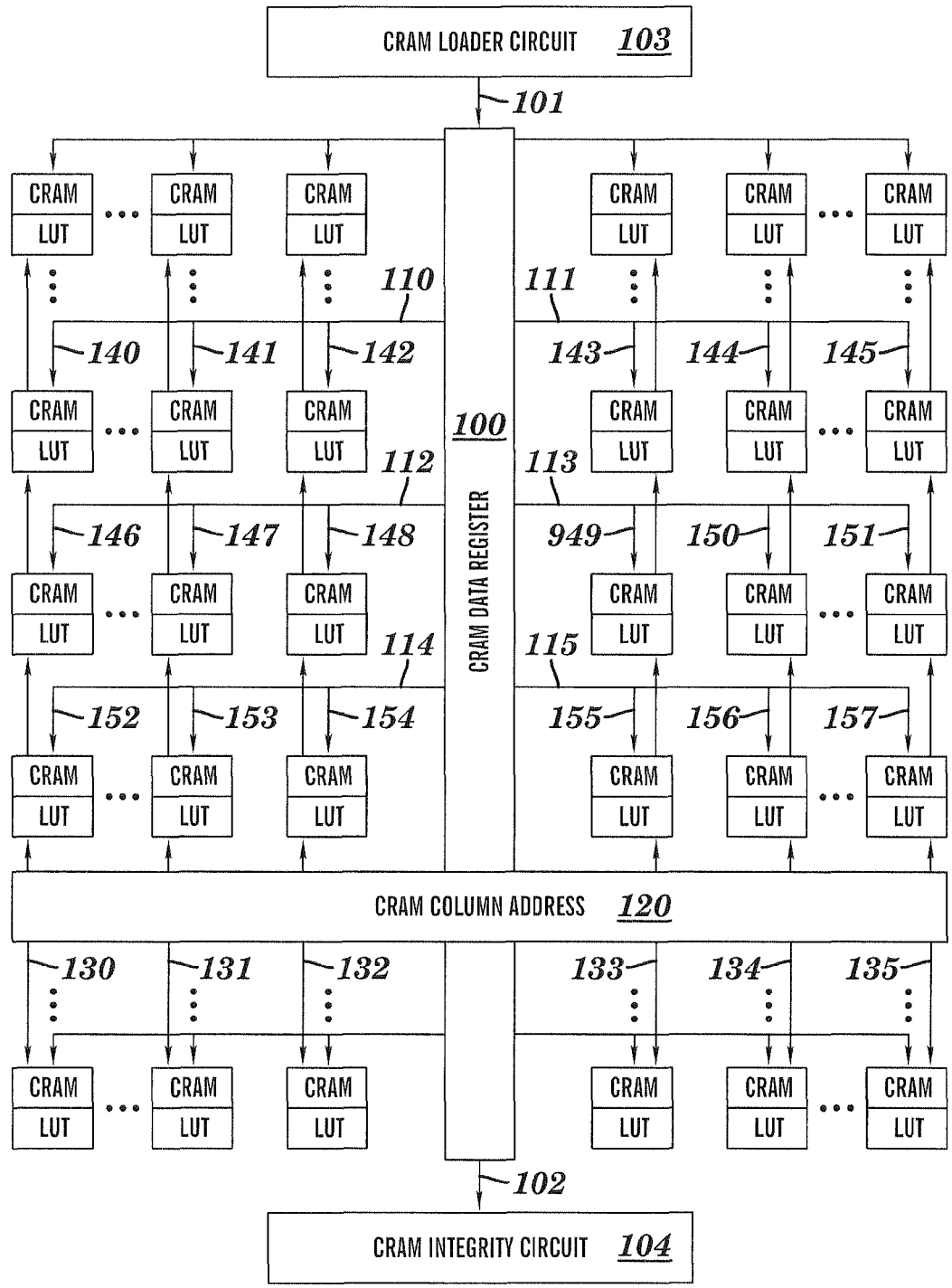
FIG. 1 is a block diagram of a topology of a contemporary field programmable gate array (FPGA)

Field programmable gate arrays (FPGAs) and complex programmable logic devices (CPLDs) are reconfigurable logic devices that include arrays of logic elements and associated configuration state memory stored, for example, in configuration random access memories (CRAMs). The CRAM is implemented by static RAM (SRAM), flash memory (FLASH), fuses and/or other types of memory. A common FPGA logic element is a configurable block of logic referred to as a look-up-table (LUT). A configuration state memory bit is output from the LUT based on user input signals. This output can be further configured for connection to a clocked register or to an interconnection fabric that can further be configured to route the output or registered output to other LUT user inputs. A basic LUT may be comprised of a 16-bit CRAM with bits individually selected by four user input signals, however variations are common.

A typical FPGA integrated circuit chip has thousands to hundreds of thousands of such LUTs. FPGA and CPLD device configuration data is loaded from outside the integrated circuit (also referred to herein has a "circuit chip" or "chip"), usually via device signal contacts or interfaces set aside for this purpose. Once loaded, a configuration data integrity checker circuit (also referred to herein as an integrity check circuit) is used to periodically validate, by reading and checking one block at a time for correctness using a cyclical redundancy code (CRC) and/or error correction code (ECC) scheme, the SRAM based CRAM content typically employed within FPGAs.

User control signals include a look-up address signal to select a CRAM state as an output for defining the configured logic function. For example, a 2-input logic "AND" function can be implemented using four CRAM bits where two user input signals select CRAM bits 0 through 3 having configured state 0, 0, 0, and 1 output respectively. Similarly, other Boolean logic functions can be implemented using other LUT combinations. FPGA CRAM states are highly under utilized, as many LUTs are unused or only partially used in applications. Many LUTs have similar or the same CRAM content when they are configured for the same Boolean logic functions. Significant reduction in CRAM can be achieved by having different CRAM structures employed on the chip, where some portion of the row and columns of LUTs employ compressed CRAM along with uncompressed CRAM LUTs. This will increase the efficiency of the FPGA circuits but reducing the total CRAM needed as well as the area, power, CRAM soft-error rate. This also reduces the amount of interconnections needed to transport CRAM state between chips within a chip stack when desired.

An embodiment of the programmable logic circuit described herein includes an array of programmable logic elements on one die and an array of memory elements on another die. In an embodiment, the programmable logic elements and memory elements are on different substrates and communicate with each other via through substrate vias (TSVs).

An embodiment includes a system to allow interchangeable use of configurable random access and non-volatile memories. Because the physical interface and logic configuration remains the same, the user may implement either version while maintaining identical physical and electrical properties. By keeping the physical and electrical properties identical between versions of the system, either version can be used interchangeably. Because the chip that directly interacts with the system is unchanged, the electrical characteristics are identical between the two implementations, and this greatly reduces variability between the versions.

In an embodiment, memory elements are implemented using random access memory (RAM), which can be both read from and written to in order to change the programming of the logic. In an embodiment, the RAM stores data referred to as configuration memory data, which is used to program the logic. A die containing the RAM is used during system test because the test may result in updates to the configuration memory. Once the programmable logic circuit has been tested and is functioning as expected, the contents of the RAM devices are copied to a non-volatile read-only-memory (ROM) on another die so that the programming is permanently retained, even when power is removed. The memory elements on the ROM die are then connected (e.g., via TSVs) to the programmable logic elements.

An embodiment uses TSV stacking to remove the configuration memory from the logic die by placing the configuration memory on a separate die (or substrate) of the stack. TSV, as known in the art, refers to a vertical electrical connection (via) passing completely through a silicon wafer or die. Also as known in the art, a three-dimensional (3D) integrated circuit is a single integrated circuit built by stacking silicon wafers and/or dies and interconnecting them vertically so that they behave as a single device.

In an embodiment, integrated circuit die stacking with packaging TSV and other packaging techniques provide the means to interconnect dies (e.g., located on different substrates) in ultra close proximity using the vertical dimension. Although these arrangements enable higher performance and packaging density, the constituent die and associated function are still designed and used as a collection of independent die as though they were packaged using conventional two-dimensional (2D) packaging techniques, despite being assembled in a unified inseparable module. Having the stacked arrangement take on the characteristics of a monolithic die has benefits for manufacturability, reliability, and extendable function. Therefore, it is beneficial to have a stacked die arrangement characteristically function like a monolithic die. It is further beneficial to be able to have stacked FPGA or CPLD devices load the configuration data through the stack.

In an embodiment, a plurality of independent FPGA or CPLD chips are stacked into a common device that includes a base die having a set of signal contacts that connect to a system through a board or substrate. Other chips within the stack are only in contact with adjacent chips and have no direct connection to the system. Each of the independent dies receives configuration memory data through the base die that has the system interface. In an embodiment, the configuration data stream is encoded to indicate which type of device is being configured, the beginning and the end of the die configuration memory data, fault detection and correction redundant data, data compression type and an indicator to indicate when the complete configuration sequence is complete for the stacked configuration.

An FPGA or CPLD device has an extensive interconnection fabric that includes a matrix of signal routing conductors arranged on the die along with periodic configurable couplings that permit the user logic outputs to be interconnected to user logic inputs. A TSV stacked die employs some of these configurable couplings to be able to couple signal routing conductors to TSV's that can reach adjacent die to extend the interconnection fabric between die.

In an embodiment, the CRAM state is accessed via a user logic interconnection fabric such as that described in United States Patent Publication Number US20100241900, entitled "System to Determine Fault Tolerance in an Integrated Circuit and Associated Methods." Having the CRAM state transferrable between die using the configurable interconnection fabric permits CRAM state to be used on a different die for reliability, repair, redundancy or non-volatility when the CRAM state is transferred from a non-volatile or more reliable CRAM source from within the die stack.

An embodiment of the present invention is a programmable logic circuit arrangement having configuration memory associated and associated logic for one or more programmable elements on separate integrated circuit chips within a chip stack. In an embodiment, the memory and programmable logic are located on different substrates and are connected to each other using 3D stacking techniques. The use of 3D stacking techniques allows the memory and logic to be optimally segregated on separate integrated circuit chips that are assembled into a single heterogeneous integrated component. These chips may use different technologies best suited for cost, reliability, performance, voltage, power, or characteristic features. Moreover, combinations of configuration memory that are both local to a logic die as well as remote from a member die in the stack can provide unique reliability, fault tolerance, cost reduction opportunities for the heterogeneous stacked chip, particularly when the programmable circuit interconnect fabric is designed to permit configuration memory state to be selectively routed and used across the die in a stack.

As used herein, the terms "configurable integrated circuit die" or "die" refers to a block of semiconducting material on which a given functional circuit (e.g., a configuration memory management circuit, a programmable logic circuit) is fabricated on a substrate. Different die are located on different substrates. As used herein, the term "substrate" refers to an independent foundation, usually a thin planar structure, on which an integrated circuit chip can be coupled. Manufacturing packaging and applications may define a substrate as an organic laminate, a glass or glass ceramic package, or the substrate may be a semiconductor or another integrated circuit. In any case the substrate will have electrical or optical conductors for coupling signals to between the integrated circuit and substrate.

Die size, integrated circuit technology, processing and test steps are directly related to cost of the die. Creating a heterogeneous die stack carries specific costs associated with such a structure, but these costs are offset by the savings in having optimal constituent die and reparability achieved by having die in the stack used to repair or recover from faults inherent to a different die in the stack. Specific die within the stack may have regions where configuration state is derived locally and regions where the configuration state is derived from a remote die for reliability and fault tolerance to unique to the specified regions. The user may configure such regions based on application requirements by using design software mapping and design management tools typically used to develop a user application for a configurable logic circuit.

In an embodiment, a plurality of independent FPGA or CPLD dies are stacked into a common device that includes a base die having a set of signal contacts that connect to a system board or substrate. In this embodiment, the stacked dies other than the base die are only in contact with other dies in the stack. Each of the independent dies receives configuration memory data that is input to the stack via an input on the base die that is connected to a system interface for receiving a configuration data stream.

In an embodiment, each die has an identical configuration memory management circuit and identical interfaces. The configuration memory management circuit receives, decodes, verifies integrity and loads the configuration memory data from the configuration data stream using an associated clock. The base die receives the configuration data stream and self-configures, including selecting the configuration data stream and clock to be propagated to the interface on the adjacent die after the base die configuration is loaded, and so on until each successive die in the stack has received its configuration. This scheme benefits from having the configuration data used to identify each die in the stack without the need for external die address, select or identification signals since each die is configured in a prescribed order.

In an embodiment, integrity checker functions (e.g., CRC, ECC) on the configuration memory management circuit are disabled to facilitate loading the configuration memory with "bad" data for error injection testing user logic fault tolerance circuits. The configuration data stream includes specific bits and protocol to switch the CRAM and data stream integrity checking on and off as desired.

FIG. 1 is a block diagram of a topology of FPGA programmable elements on a single die, in accordance with an embodiment. A single grouping of programmable elements, of which there may be many in a single FPGA chip, is illustrated in FIG. 1. The grouping's size will be determined by the physical characteristics of the architecture of the FPGA. The central structures in FIG. 1 are the data access register arrangement 100 and the addressing function 120 that determine which of the programmable elements 140-157 are being acted upon. Each of these structures in FIG. 1 are fed by a central CRAM loader circuit 103 that is designed to load one or more such structures and will feed to a central CRC checking structure 104 that can check many of these structures. The data access register arrangement 100 is fed from the central load mechanism by a scan connection 101 and feeds to the central CRC checking structure 104 by a scan connection 102.

Each programmable element 140-157 includes two parts: the CRAM and the LUT. The size of the CRAM in each cell is determined by the extent of the programmability of the LUT (i.e., the programmable logic). The size of the CRAM and the desired speed to conduct the checking will determine the extent of the checking performed.

The addressing function 120 determines which programmable element or elements 140-157 will be loaded or read to the data access register arrangement 100 in any given cycle.

The data access register arrangement 100 is connected to the programmable elements 140-157 by data buses 110-115 which are each as wide as the CRAM in a single programmable element 140-157.

The control from the addressing function 120 to each programmable element is connected by address selection signals 130-135. It is possible to load multiple programmable elements in a single column in this example such as 140, 146, and 152.

In an embodiment, the FPGA integrated circuit shown in FIG. 1 is part of a configurable die stack arrangement that includes at least two FPGA dies (or other configurable integrated circuit dies). In an embodiment, each of the dies is located on a different substrate. Each die in the die stack includes a configuration memory management circuit to load configuration data into the FPGAs (e.g., into the central CRAM loader circuit 103 of FIG. 1). One of the configuration memory management circuits (e.g., the base die) receives configuration memory data from a source located outside of the die stack (e.g., from a test generator or a configuration generator). The rest of the configuration memory management circuits in the die stack receive configuration memory management data from another configuration memory management circuit in the die stack.

In an embodiment, the configuration memory management circuit located on the die at the bottom of the die stack receives memory management data from outside of the die stack, selects the memory management data applicable to the bottom die stack and sends memory management data to the next die in the stack. In an embodiment, the selecting and sending is performed by control circuitry located on the configuration memory management circuit. This process of receiving memory management data from a previous die and transmitting memory management data to a next die in the stack continues for each die in the stack that contains a configuration memory management circuit. Thus, only one die in the die stack is required to have an output pin (or other means) to communicate to an entity (e.g. a circuit) outside of the die stack.

Figure 2:
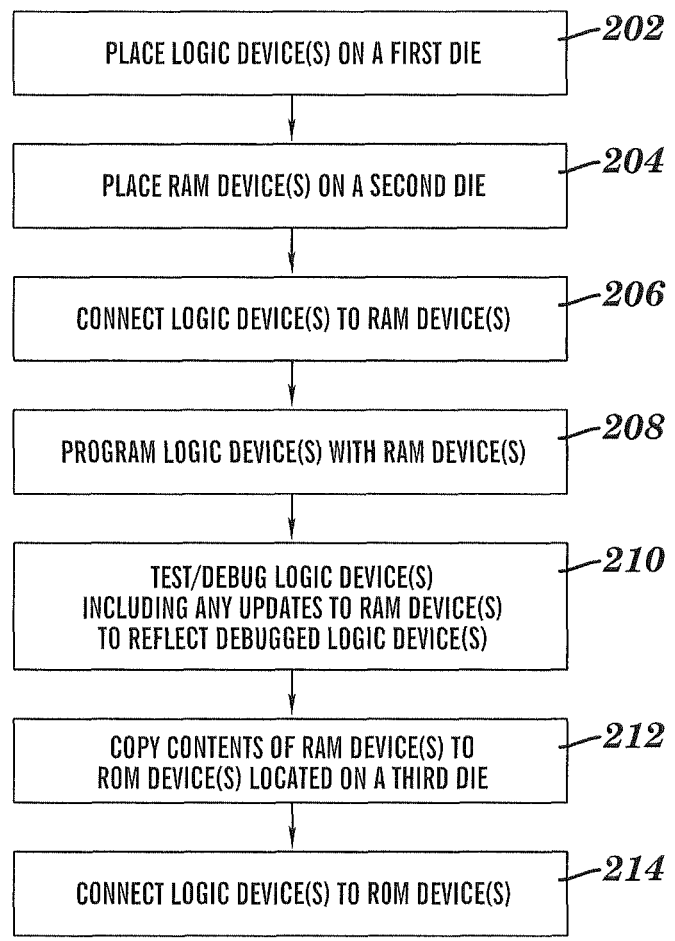
FIG. 2 depicts a process flow for testing logic circuits in accordance with an embodiment.

FIG. 2 depicts a process flow for testing logic circuits in accordance with an embodiment. The process flow depicted in FIG. 2 may be used to modify features and/or functions of programmable logic circuit by using a RAM device when testing, fixing errors and/or updating features on the programmable logic circuit. The resulting RAM content is then copied into a ROM which is used in the programmable logic circuit during production.

As used herein, the term "test" or "test mode" refers to the programmable logic circuit being tested (e.g., design is verified) and debugged, prior to being used by a customer to perform business operations. This is contrasted with the term "production" or "production mode" which refers to the programmable logic circuit being used by a customer to perform business activities. Production mode generally occurs after design validation has been completed.

Referring to FIG. 2, at block 202, logic devices containing the logic portions of programmable elements are placed on a first die, and at block 204, RAM devices containing the memory portions of the programmable elements are placed on a second die. The logic devices are connected (e.g., via TSV) to the memory devices at block 206, and at block 208, the logic devices are programmed with contents of the RAM devices. The logic devices are tested and debugged at block 210. In an embodiment, a controller performs the programming and the testing/debugging is performed by using the device in the system as it would be used in the finished product. During the testing (or test mode), contents of the RAM devices may be updated to reflect any changes required to the logic devices discovered during the testing and debugging process. Once testing and debugging are completed, the RAM devices on the second die are disconnected from the logic devices on the first die. At block 212, the contents (e.g., configuration data) of the RAM devices are copied to ROM devices located on a third die. The logic devices on the first die are connected (e.g., via TSV) to the ROM devices on the third die at block 214 and used to program the logic devices. The programmable logic circuit formed by the first die and the third die is utilized in a production mode.

The process described in reference to FIG. 2 allows a user to retain the logic element of the stack and choose between programmable memory (e.g., RAM) and ROM for another element of the stack. By choosing programmable memory, the user may develop and modify the configuration data, for example. Once the user is satisfied with the configuration data, a ROM, which contains the configuration data is created. The ROM then replaces the programmable memory in the stack, while retaining the logic element of the stack. The logical and signaling characteristics of the stack are retained, while the ROM does not require initialization from a state stored outside the stack and is therefore resistant to logic upsets from environmental radiation, removal of power, or the like.

The process depicted in FIG. 2 allows the user to quickly go from a fully programmable environment (which also would require programming at power on time) to an environment that is ready and does not require programming at power on time. Thus, embodiments provide the ability to switch between these two environments easily using the common "first die".

Figure 3:
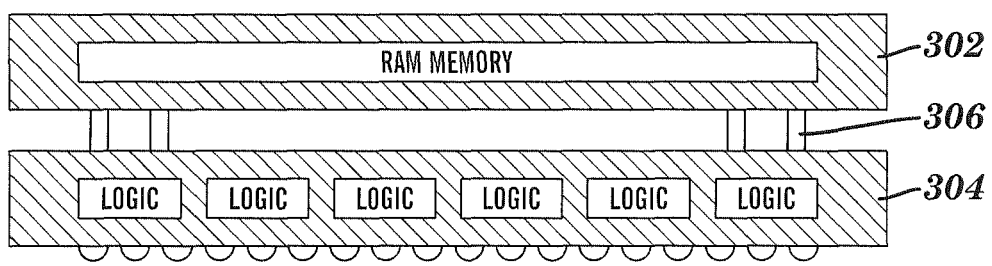
FIG. 3 is a block diagram of a side view of a FPGA with random access memory (RAM) in a three-dimensional (3D) stack in accordance with an embodiment.

FIG. 3 is a block diagram of a side view of a FPGA in a 3D stack in accordance with an embodiment. As shown in FIG. 3, a die 302 (or substrate) containing RAM memory elements is attached, using TSVs 306, to a die 304 (or substrate) containing logic elements.

Figure 4:
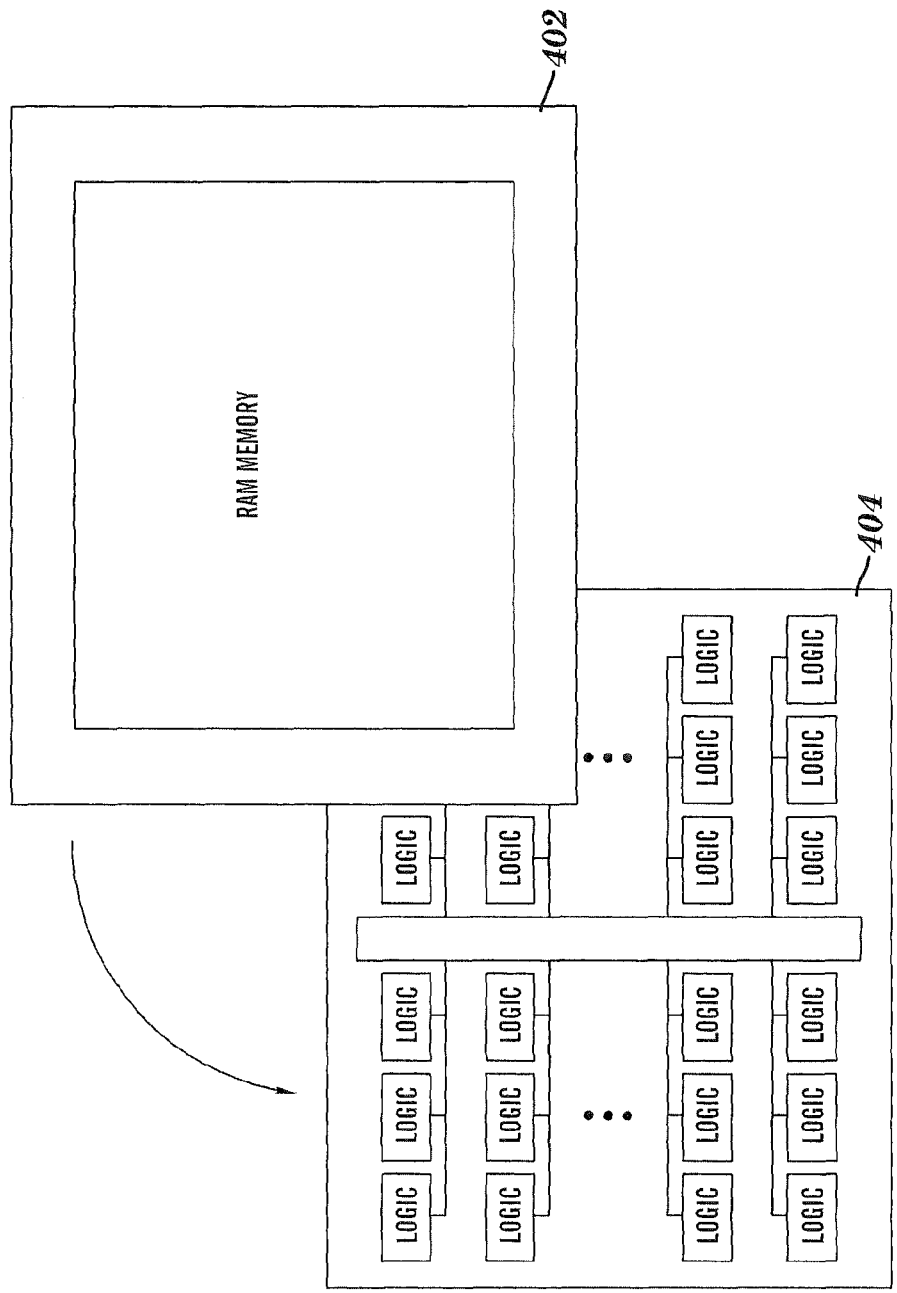
FIG. 4 is a block diagram of a FPGA with RAM in a 3D stack in accordance with an embodiment.

FIG. 4 is a block diagram of a FPGA in a 3D stack in accordance with an embodiment. One die 404 (or substrate) of the stack carries the programmable logic of the FPGA, and another die 402 (or substrate) of the stack carries the configuration data for the logic in the first element of the stack. The memory is programmable and implemented by static RAM, dynamic RAM, or the like. In the embodiment shown in FIG. 4, the programmable logic is configured by the data contained in the memory attached in the stack. TSVs connect the two dies of the stack physically and electrically.

Figure 5:
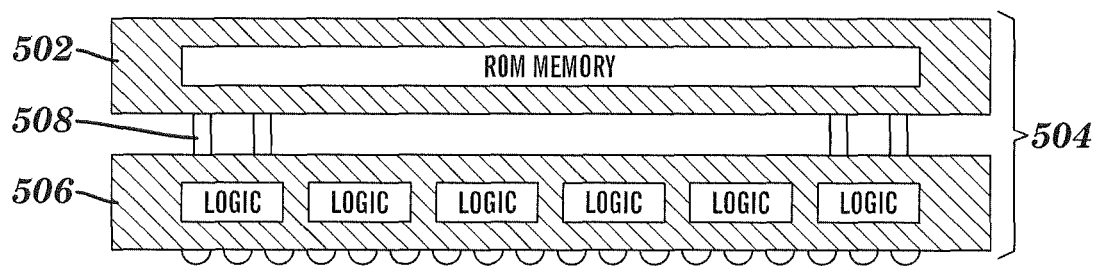
FIG. 5 is a block diagram of a side view of a FPGA with read only memory (ROM) in a 3D stack in accordance with an embodiment.

FIG. 5 is a block diagram of a side view of a FPGA with ROM in a 3D stack in accordance with an embodiment. A first die 506 of the stack 504 (or substrate) carries the programmable logic of the FPGA, and another die 502 (or substrate) of the stack 504 carries the configuration data for the logic in the first die 506 of the stack 504. The memory is not programmable and is implemented by ROM, or the like. In the embodiment shown in FIG. 5, the programmable logic is configured by the data contained in the memory attached in the stack 504. TSVs 508 connect the two die of the stack physically and electrically.

Figure 6:
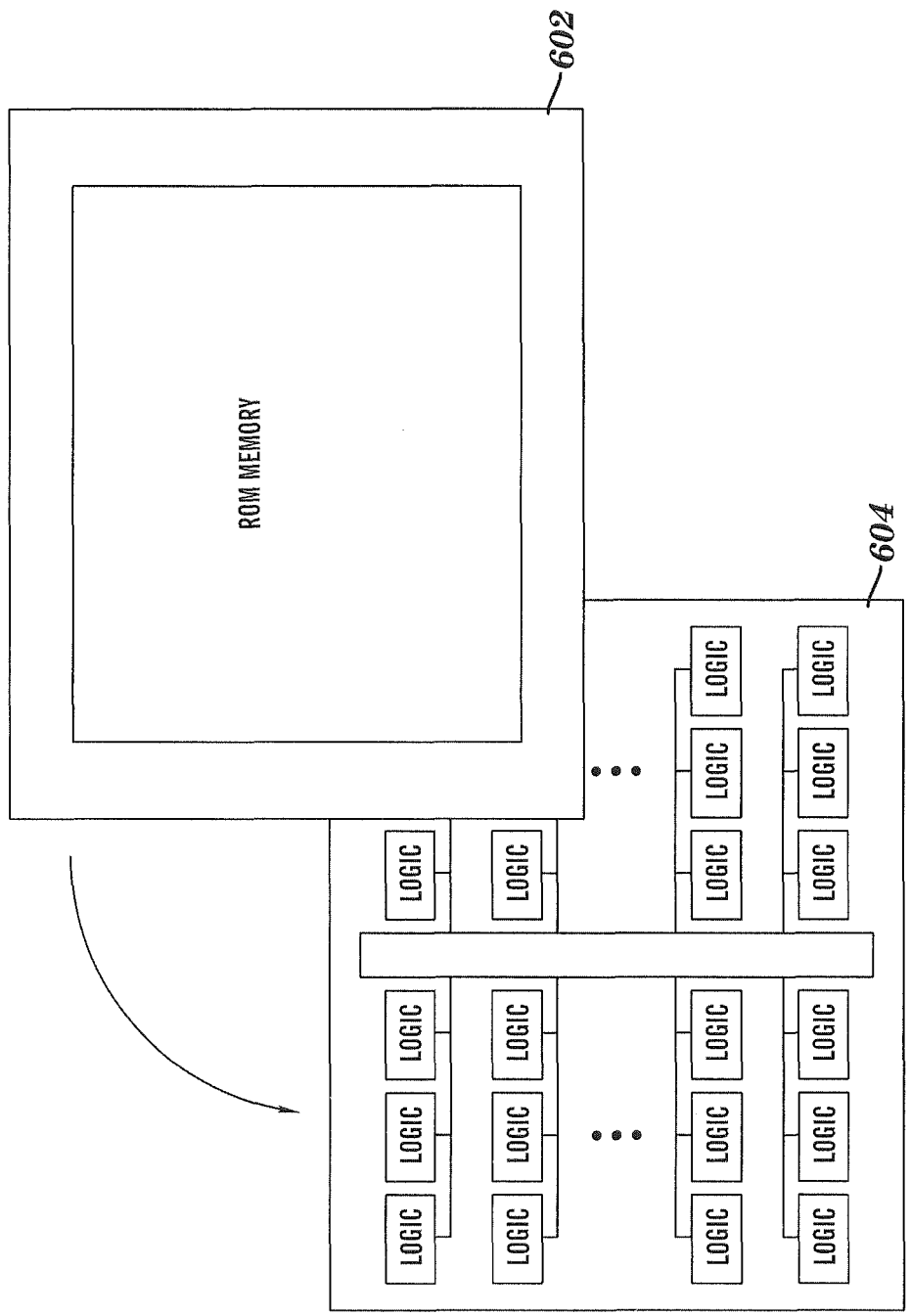
FIG. 6 is a block diagram of a FPGA with ROM in a 3D stack in accordance with an embodiment.

FIG. 6 is a block diagram of a FPGA with ROM in a 3D stack in accordance with an embodiment. As shown in FIG. 6, a die 602 (or substrate) containing ROM memory elements is attached, using TSV, to a die 604 (or substrate) containing logic elements.

Figure 7:
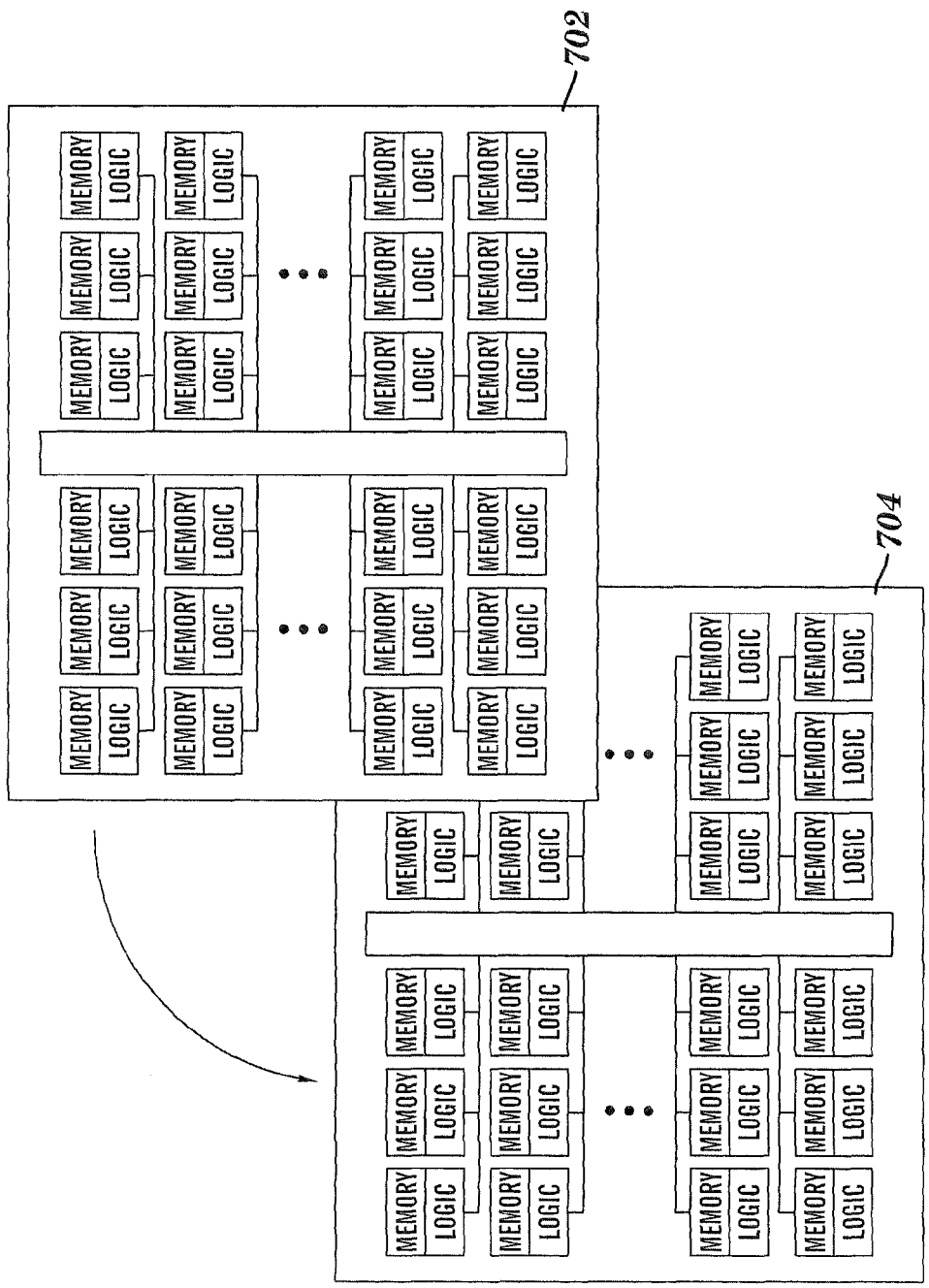
FIG. 7 is a block diagram of a programmable logic circuit in accordance with an embodiment.
Figure 8:
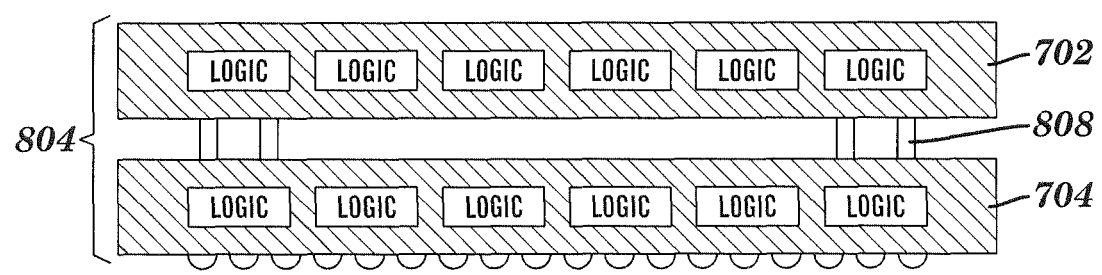
FIG. 8 is a block diagram of a side view of a programmable logic circuit in accordance with an embodiment.

In another embodiment, as shown in FIGS. 7 and 8, the programmable logic and the configuration memory remain in a programmable element (e.g., on the same die 702) of the stack 804. Another die 704, carrying both memory and logic, is attached to the 3D stack using TSVs 808. This embodiment allows for smaller FPGA integrated circuits to be aggregated, thereby creating a larger FPGA by increasing the available programmable logic that would be available from either die 702 704 without stacking. This embodiment saves cost by reducing the size of the dies 702 704 required. Smaller chip sizes are easier and cheaper to make. By being able to stack smaller chips to make a larger chip equivalent, the cost of making the module could be reduced, as well as the footprint of the device when compared to the larger chip.

Because the interconnects going from die to die in a TSV stack are finite, if configuration memory data that needs to be sent from one die to the other is more than can be accommodated by the available TSV connections, compression may be used. In an embodiment, compression techniques (e.g., such as those described in U.S. Pat. No. 4,891,643) are used. By using compression, fewer signal bits are required to deliver more data bits from the memory to the logic that requires the configuration bits. The compressed format is the data encoding determined by the compression algorithm.

Figure 9:
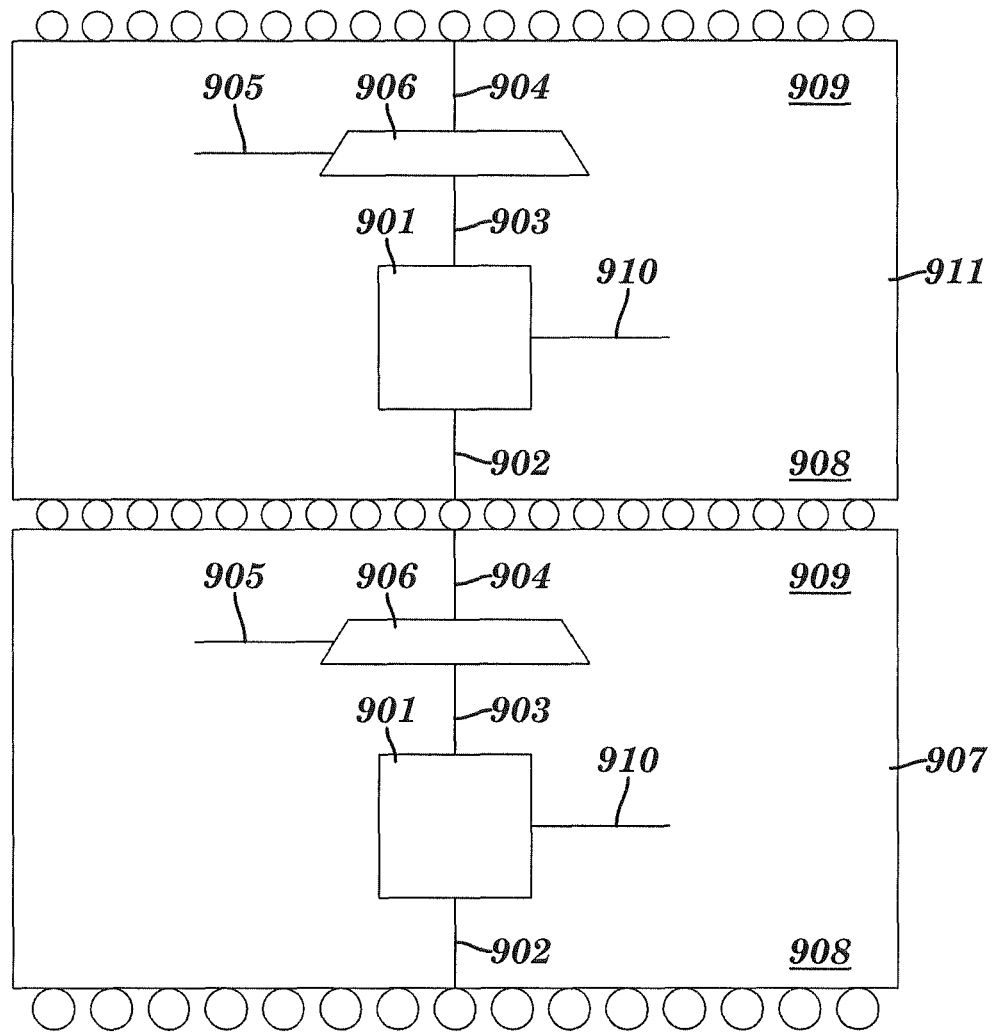
FIG. 9 is a block diagram of configuration memory management circuits located on two dies in a stack in accordance with an embodiment.

FIG. 9 is a block diagram of die stack having two configuration memory management circuits located on two configurable integrated circuit dies in accordance with an embodiment. In the embodiment shown in FIG. 9, a configuration memory management circuit is located on a base configurable integrated circuit die 907 and on an adjacent configurable integrated circuit die 911. More than one configuration memory management circuit may be implemented and operated in parallel on a common die. In an embodiment, the configuration memory management circuits receive, decode, verify integrity, and load the configuration memory data from the configuration data stream and an associated clock.

As shown in FIG. 9, the configuration memory management circuits include: a system input 902 connected to an electrode on one side of the die 908 for receiving a configuration memory data stream; a circuit 901 to control the path of the configuration memory data stream (e.g., to a loader circuit on the die, such as central CRAM loader circuit 103 or to another die); an interface 910 to a loader circuit on the die for sending configuration memory data to configure the CRAM on the die; an interface 903 to send configuration memory data to a multiplexer 906, a select signal 905 to allow data to flow through the multiplexer 906; and a system output 904 connected to the output from the multiplexer 906 and to an electrode an another side 909 of the die for transmitting the portion of the configuration memory stream not used by the current die to an adjacent die.

The base configurable integrated circuit die 907 as shown in FIG. 9 receives the configuration data stream via the system input 902 and self-configures, including decoding the configuration data stream to generate a select signal 905 to select the configuration data stream and clock to be propagated via a system output 904 to an adjacent configurable integrated circuit die 911 system input 902 and circuit 901 after the base configurable integrated circuit die 907 configuration is loaded, and so on until each successive die in the stack has received its configuration In an embodiment, the portion of the circuitry on the configurable integrated circuit die 907 that generates the select signal 905 along with the multiplexer 906 is referred to herein as the control circuit.

Figure 10:
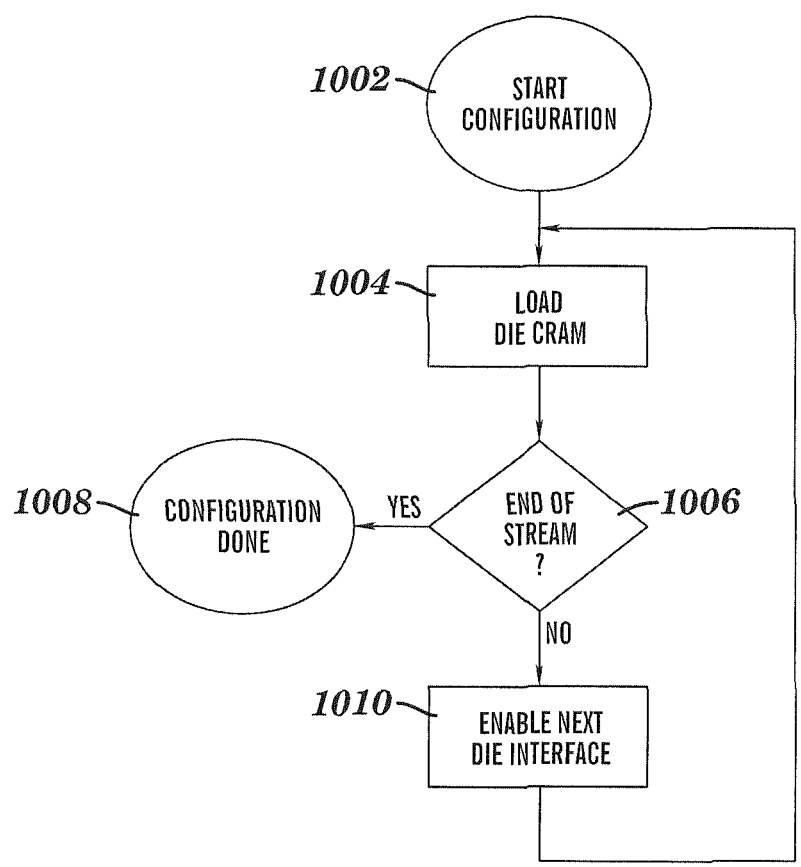
FIG. 10 depicts a process flow for configuring a FPGA in accordance with an embodiment.

FIG. 10 depicts a process flow for configuring programmable logic elements (e.g., FPGAs, CRAMs) in a die stack in accordance with an embodiment. At block 1002, a configuration data stream, that includes configuration memory data, is received at a die (e.g., a base die) in a die stack. In an embodiment, the die is one of several dies in a die stack and the configuration data stream is received via a system input, such as system input 902. At block 1004, the configuration data stream is transmitted to a loader circuit, such as central CRAM loader circuit 103, on the die. When all of the configuration data for the current die has been received, block 1006 is performed to determine if there is additional data in the configuration data stream. In an embodiment, at block 1004, a circuit, such as circuit 901 counts the number of configuration data bits received and when the number of bits required for configuring the current die have been received, processing continues at block 1006.

In another embodiment, once a buffer or other storage mechanism is full, processing continues at block 1006. In an embodiment, once all of the configuration memory data is loaded into the loader circuit, the configuration of the die is automatically initiated. At block 1006, it is determined if there are additional bits in the configuration data stream. If there are no additional bits, block 1008 is performed and the transmission of configuration data to the dies in the stack is complete. If there are additional bits, block 1010 is performed and the circuitry enables the next die in the stack to receive the configuration data stream. In the embodiment depicted in FIG. 9, this occurs when the circuit 901 generates a select signal 905 to the multiplexer 906 to open a gate to allow the configuration data stream to flow to the system output 904 and up to the next die.

A variety of manners of applying the configuration data stream to dies in the die stack may be implemented. In an embodiment, transmission of configuration data is complete when all of the dies in the stack have received bits in the configuration data stream. In another embodiment, transmission of configuration data is complete when selected dies in the stack have received bits from the configuration data stream. In this embodiment, a subset of the dies in the stack receive bits from the configuration data stream. For selected dies, the interface to the configuration data stream is disabled, thus allowing the die to ignore date received from the base die configuration management circuit. In one embodiment, a selected number of dies closest to the base die receive configuration data. In another embodiment, the configuration data stream specifies selected dies for receiving all or portions of the configuration data stream.

Embodiment described herein benefit from having the configuration data used to identify each die in the stack without the need for external die address, select or identification signals since each die is configured in a prescribed order. In an embodiment, the integrated circuit dies also include error detection and correction circuitry to detect and correct errors in configuration memory data received via the system inputs 902. In an embodiment, the integrity checker in the circuit is configured to disable checking to facilitate loading the configuration memory with "bad" data (error injection) for testing user logic fault tolerance.

Another embodiment avoids using the conventional system input 902 for a non-base die, such as die 911, and instead configures a connection directly to a programmable logic circuit data register complex, such as CRAM data access register arrangement 900. These devices use a post decoded and generally wider on-die bus connection that is exposed only to the stacked die configuration having higher density micro contacts. This structure can benefit from sharing and remaining under control of the base die configuration management loader and or integrity circuits.

In another embodiment, certain configuration data is transmitted between die where it may be directly used as configuration data on the receiving die or as compare data by user logic or the configuration controller or integrity checker for detecting and correcting faults with the configuration data.

Such configuration data is coupled between dies via the configurable interconnection matrix connections. All or part of this configuration data may be compressed at the source die by user logic before routing to the adjacent die to reduce interconnection signal contacts between die. In an embodiment, the configuration data is transmitted in time domain multiplexed high speed bursts to reduce the signal contacts between the die. The compressed and/or high-speed data is decompressed and re-constructed after being received for use as configuration data in the receiving die.

In another embodiment, the configuration data is mapped or allocated between the stacked die such that high reliability user logic is placed on one die and lower reliability user logic is located to another die such that the configuration data integrity checker may be configured by user logic or from the device configuration tools to check all or part of the configuration data RAM at an accelerated rate. Controlling the configuration data integrity checker rate may be further controlled by locality on a die as directed by user logic or by the device configuration tools.

In a further embodiment, the configuration memory includes embedded DRAM (EDRAM) and has a memory refresh synchronization circuit to align EDRAM refresh with the user logic clock period (also referred to herein as a user clock period) to avoid refresh that would cause the configuration memory state uncertainty during the user logic setup and hold stability time requirements at receiving clocked registers and constrained device outputs.

Technical effects and benefits include the ability to change the functionality of a programmable logic circuit by switching the ROM containing the configuration logic. Additional benefits include the ability to reduce the size of the programmable logic circuit and to operate more efficiently. A further benefit is the ability to configure the integrated circuit dies in a die stack using a single external interface to communicate outside of the stack.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method of configuring a plurality of configurable integrated circuit dies, the method comprising:
   receiving a configuration data stream at an output pin of a die in a die stack, the configuration data stream comprising configuration memory data for a plurality of configuration memories and logic devices located on dies in the die stack, at least two of the dies in the die stack located on different substrates; and
   performing for each die in the die stack:
      receiving, at a current die in the die stack, the configuration memory data for the current die;
      storing, by the current die, the configuration memory data for the current die in a configuration memory on the current die;
      determining, by the current die, whether the configuration data stream includes configuration memory data for an additional die in the die stack; and
      transmitting, by the current die, the configuration data stream to the additional die in the die stack responsive to the configuration data stream including configuration memory data for the additional die in the die stack, wherein after the transmitting the additional die is the current die.

2. The method of claim 1, further comprising configuring the plurality of logic devices responsive to contents of the plurality of configuration memories.

3. The method of claim 1, wherein the transmitting between dies is performed using through substrate vias (TSVs).

4. The method of claim 1, further comprising compressing the configuration data stream prior to the transmitting.

5. The method of claim 1, further comprising performing error detection and correction on the configuration data stream.

6. The method of claim 1, wherein the die stack includes at least three dies.

7. A method of testing configuration data for configurable integrated circuit dies, the method comprising:
   receiving a test configuration data stream at an output pin of a die in a die stack, the test configuration data stream comprising configuration memory data for a plurality of configuration memories and logic devices located on dies in the die stack, at least two of the dies in the die stack located on different substrates, the configuration memory data comprising at least one faulty bit;
   placing the die stack in a test mode that disables error detection and correction of the test configuration data stream;
   performing for each die in the die stack:
   receiving, at a current die in the die stack, the configuration memory data for the current die;
   storing, by the current die, the configuration memory data for the current die in a configuration memory on the current die;
      determining, by the current die, whether the test configuration data stream includes configuration memory data for an additional die in the die stack;
      transmitting, by the current die, the test configuration data stream to the additional die in the die stack responsive to the test configuration data stream including configuration memory data for the additional die in the die stack, wherein after the transmitting the additional die is the current die; and
   testing the logic devices.

8. The method of claim 7, wherein the die stack includes at least three dies.

9. A programmable logic circuit comprising:
   a through silicon via (TSV);
   a first die comprising a programmable logic device;
   a second die comprising a random access memory (RAM) device for storing configuration memory data, the programmable logic device and the RAM device configured to communicate via the TSV to program the programmable logic device using the configuration memory data; and
   a third die comprising a read only memory (ROM) device, wherein upon completion of configuration testing, contents of the RAM are programmed into the ROM, memory elements on the ROM are connected to programmable logic elements on the first die, and the RAM is disconnected from the first die,
   the TSV, the first die and the third die forming a three-dimensional (3D) stack.

* * * * *